United States Patent
Tatsuta et al.

(10) Patent No.: US 6,859,502 B1
(45) Date of Patent: Feb. 22, 2005

(54) TRANSMITTING AND RECEIVING APPARATUS CAPABLE OF THE SUPPRESSION OF THE MICROPHONIC NOISE IN DIGITAL TRANSMISSION SYSTEM

(75) Inventors: Akihiro Tatsuta, Kyoto (JP); Shotaro Tanaka, Katano (JP); Koji Arii, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/484,441

(22) Filed: Jan. 18, 2000

(30) Foreign Application Priority Data

Jan. 19, 1999 (JP) .......................... 11-010600

(51) Int. Cl.[7] .............................. H04L 27/28; H03L 1/00
(52) U.S. Cl. ........................................ 375/260; 375/219
(58) Field of Search ................................ 375/219, 222, 375/259, 260, 356, 377

(56) References Cited

U.S. PATENT DOCUMENTS

| | | | |
|---|---|---|---|
| 4,079,329 A | | 3/1978 | England et al. ............... 329/50 |
| 5,021,749 A | | 6/1991 | Kasai et al. |
| 5,402,087 A | | 3/1995 | Gorczak |
| 5,406,235 A | | 4/1995 | Hayashi |
| 5,434,542 A | | 7/1995 | Veith et al. |
| 5,574,570 A | * | 11/1996 | Ohkuma et al. ............ 386/103 |
| 5,600,365 A | | 2/1997 | Kondo et al. |
| 5,917,634 A | * | 6/1999 | Otobe ........................ 398/201 |
| 6,115,426 A | | 9/2000 | Fujimoto et al. |
| 6,134,419 A | * | 10/2000 | Williams ................... 725/151 |
| 6,320,842 B1 | * | 11/2001 | Mochizuki ................. 370/206 |

FOREIGN PATENT DOCUMENTS

| | | |
|---|---|---|
| EP | 0 557 058 | 8/1993 |
| GB | 2 118 392 | 10/1983 |
| JP | 2-48824 | 2/1990 |
| JP | 2-296425 | 12/1990 |
| JP | 5-136612 | 6/1993 |
| JP | 6-85700 | 3/1994 |
| JP | 7-95109 | 4/1995 |
| JP | 7-183866 | 7/1995 |
| JP | 7-255043 | 10/1995 |
| JP | 7-288483 | 10/1995 |
| JP | 9-219576 | 8/1997 |
| JP | 10-215119 | 8/1998 |
| JP | 20-210099 | 8/1998 |
| JP | 10-285021 | 10/1998 |
| WO | WO 98 52277 | 11/1998 |
| WO | WO 99 00892 | 1/1999 |
| WO | WO99/41838 | 8/1999 |

OTHER PUBLICATIONS

Toshiyuki Ozawa, "PLL Shuhasu Synthesizer Kairo Sekkei Ho.", Sougou Denshi Syuppannsya, 1994 with English language translation.

(List continued on next page.)

*Primary Examiner*—Young T. Tse
(74) *Attorney, Agent, or Firm*—Smith, Gambrell & Russell, LLP

(57) ABSTRACT

A transmitting and receiving apparatus including a modulating circuit for modulating an input digital data; a first frequency converting circuit for converting a signal output from the modulating circuit into a signal of a predetermined frequency, an amplifying/branching circuit for amplifying and branching a signal output from the first frequency converting circuit; a second frequency converting circuit for converting a signal output from the amplifying branching circuit, into a signal of a predetermined frequency; and a demodulating circuit for demodulating digital data from a signal output from the second frequency converting circuit.

8 Claims, 12 Drawing Sheets

OTHER PUBLICATIONS

Hiroshi Fujiwara et al., "MPEG System for Multiplying Multimedia", pp. 231 of "Saishin MPEG Kyoukasyo", (1994, ASCII Shuppankyoku) with English language translation.

Yoshihiro Konishi, "Microwave Kairo No Kiso To Sono Oyo", Sougou Denshi Syuppansya, 1990, pp. 172, with English language translation.

RTCA, Inc. "Environmental Conditions and Test Procedures for Airborne Equipment", Section 8, Vibration, Date of Issue: Jul. 29, 1997, RTCA/DO–0160D, pp 8–1 to 8–23.

MITEL Semiconductor "TV/Satellite Synthesisers—Basic Design Guidelines" Application Notes, AN168—2.4 Jun. 1995, pp. 1–9.

Lindsey, William C., et al. "A Survey of Digital Phase–Locked Loops" Proceedings of the IEEE, vol. 69, No. 4, Apr. 1981, pp. 410–431.

Patent Abstracts of Japan, vol. 015, No. 419, Oct. 24, 1991 & JP 03 174816 A (Toshiba Corp), Jul. 30, 1991 *abstract*.

* cited by examiner

TRANSMITTING AND RECEIVING APPARATUS CAPABLE OF THE SUPPRESSION OF THE MICROPHONIC NOISE IN DIGITAL TRANSMISSION SYSTEM

BACKGROUND OF THE INVENTION

1. Field of the Invention

The present invention relates to a transmitting and receiving apparatus which is to be mounted in a mobile unit such as an airplane, and particularly to a transmitting and receiving apparatus which digitally transmits a video and a sound.

2. Related Art of the Invention

Recently, a digital video/audio system according to the MPEG standard is practically used in satellite broadcasting, a CATV, etc. In a video/audio service in an airplane, an analog broadcasting system is mainly used at the present time. Such a system is desired to be replaced with a digital broadcasting system in which an image compression technique such as MPEG is combined with a digital modulation technique, so that the number of transmission channels is increased and services are individually provided to all seats (for example, Japanese Patent Publication (Kokai) No. HEI7-255043).

Hereinafter, an example of a transmitting and receiving apparatus of the prior art will be described with reference to the drawings.

FIG. 6 shows the configuration of a transmitting and receiving apparatus of the prior art. In FIG. 6, 61 denotes modulating means, 62 denotes first frequency converting means, 63 denotes amplifying/branching means, 64 denotes second frequency converting means, and 65 denotes demodulating means. FIG. 7 shows the configuration of a PLL frequency synthesizer included in each of the first and second frequency converting means 62 and 64. In FIG. 7, 71 denotes a PLL synthesizer IC, 72 denotes a loop filter, 73 denotes a voltage controlled oscillator, and 74 denotes a crystal oscillator.

The operation of the thus configured transmitting and receiving apparatus will be described.

First, video data and audio data which have been converted into a digitized form are input to the modulating means 61. The modulating means 61 performs quadrature amplitude modulation (hereinafter, abbreviated as QAM modulation) which is used in a CATV and the like, or vestigial sideband modulation (hereinafter, abbreviated as VSB modulation) on the data and produces a signal of a center frequency f1.

AS the center frequency f1, frequently, 44 or 43.75 MHz is used in Japan and USA, and 36.125 MHz is used in Europe. A signal output from the modulating means 61 is input to the first frequency converting means 62.

In the first frequency converting means 62, the center frequency of the input signal is converted from f1 to f2. In an airplane, a frequency in a frequency band of several tens to several hundreds MHz is usually used as the center frequency f2. A signal output from the first frequency converting means 62 is input to the amplifying/branching means 63.

The amplifying/branching means 63 amplifies and branches the input signal, and outputs the amplified and branched signals in order to distribute the signals to various areas of the airplane. The signals output from the amplifying/branching means 63 are input to the second frequency converting means 64. In the second frequency converting means 64, the center frequency of each of the input signals is converted from f2 to f3.

The center frequency f3 is equal to the frequency f1. The signals output from the second frequency converting means 64 are input to the demodulating means 65. The demodulating means 65 demodulates the input signals and outputs reproduced data.

In each of the first and second frequency converting means 62 and 64, a PLL frequency synthesizer is used. Hereinafter, the operation of a PLL frequency synthesizer will be described with reference to FIG. 7.

The crystal oscillator 74 is connected to the PLL synthesizer IC 71, and generates a signal Sxtal by using an internal oscillation circuit. The signal Sxtal is converted into a signal Sref by an internal programmable frequency divider (hereinafter, referred to as R counter).

When the frequency of the crystal oscillator 74 is set to 4 MHz and the R counter is set to 16, for example, the signal Sref has a frequency of 4 MHz/16=250 kHz. On the other hand, a signal Svco is input to the PLL synthesizer IC 71 from the voltage controlled oscillator 73. The signal Svco is converted by another internal programmable frequency divider (hereinafter, referred to as MA counter) into a signal Sdiv. When the MA counter is set to 2,800, for example, the relationship of the signal Sdiv=Svco/2, 800 is established.

A phase comparator included in the PLL synthesizer IC 71 compares the phases of the signals Sref and Sdiv with each other, and produces a signal Serr which is proportional to the phase difference. For example, when the phase of the signal Sdiv leads that of the signal Sref, the signal Serr of a positive voltage is output. By contrast, when the phase of the signal Sdiv lags that of the signal Sref, the signal Serr of a negative voltage is output, and, when the phase of the signal Sdiv coincides with that of the signal Sref, the signal Serr of a zero voltage is output.

The signal Serr output from the PLL synthesizer IC 71 is input to the loop filter 72. The loop filter 72 has a frequency characteristic of allowing only a signal of a low frequency region to pass therethrough, and smoothes the input signal to remove noise components. A signal output from the loop filter 72 is input to the voltage controlled oscillator 73.

The voltage controlled oscillator 73 is an oscillator in which the oscillation frequency is changed in accordance with the level of the input signal. As the voltage level of the input signal is higher, for example, the frequency of an output signal is higher.

When the PLL frequency synthesizer is configured as described above, the phase of the signal Sdiv is controlled so as to coincide with that of the signal Sref. Therefore, the signal Svco output from the voltage controlled oscillator 73 has a frequency of Sref×2,800=250 kHz×2,800–700 MHz. When the setting of the MA counter is changed, a different oscillation frequency can be obtained from the voltage controlled oscillator 73 (for example, "PLL SHUHASU SYNTHESIZER KAIRO SEKKEI HO," 1994, SOGO DENSHI SHUPPANSHA).

As a result, when PLL frequency synthesizers are used as the oscillators respectively included in the first and second frequency converting means 62 and 64, the frequency f2 can be changed in the range of several tens to several hundreds MHz.

Large mechanical shocks and vibrations are applied to the transmitting and receiving apparatus which is mounted in an airplane. Such mechanical shocks and vibrations increase errors in the reproduced data output from the demodulating means 65. The data error is caused mainly by noises which are generated by externally applied mechanical shocks and vibrations from a capacitor of the loop filter 72, and a capacitor and a coil of the voltage controlled oscillator 73 in the first and second frequency converting means 62 and 64. Therefore, the phase noise characteristics of the signals output from the PLL frequency synthesizers are impaired.

As a method of suppressing noises which are generated by mechanical shocks and vibrations from a PLL frequency synthesizer, the following methods have been proposed.

As a first proposal, a method is proposed in which a PLL frequency synthesizer is mounted on a mini module circuit board and the module circuit board is implanted into the main circuit board (Japanese Patent Publication (Kokai) No. HEI6-85700). In the method, when vibrations are applied, the vibrations are first absorbed by the main circuit board to suppress transmission of the vibrations to the mini module circuit board on which the PLL frequency synthesizer is mounted, and no consideration is given to devices used in the PLL frequency synthesizer and the circuit constants of the PLL.

As a second proposal, a method is proposed in which a capacitor used in a loop filter of a PLL frequency synthesizer is configured by a non-laminated capacitor (Japanese Patent Publication (Kokai) No. HEI7-288483). In the method, the piezoelectric effect is reduced by the user of a non-laminated capacitor, and no consideration is given to the circuit constants of the PLL.

As a third proposal, a method is proposed in which capacitors used in a loop filter of a PLL frequency synthesizer are mounted on the front and back faces of a circuit board, and electrically connected in parallel to each other (Japanese Patent Publication (Kokai) No. HEI9-219576). In the method, the mounting of capacitors on the front and back faces of a circuit board enables the capacitors to be compensated with each other even when the circuit board is bent, and no consideration is given to devices used in the PLL frequency synthesizer and the circuit constants of the PLL.

Furthermore, the first to third proposals are methods of suppressing noises which are generated by mechanical shocks and vibrations from a PLL frequency synthesizer, and fail to consider portions of a transmitting and receiving apparatus other than the PLL frequency synthesizer.

In a transmitting and receiving apparatus which transmits digitized video and audio data, the above-mentioned countermeasures that, as described above, are performed on a loop filter or a PLL frequency synthesizer or a circuit board on which a PLL frequency synthesizer is mounted are insufficient for attaining a desired effect under an environment of severe shocks and vibrations in an airplane. Therefore, such an apparatus remains to have a problem in that data errors cannot be suppressed.

SUMMARY OF THE INVENTION

It is an object of the invention to provide a transmitting and receiving apparatus in which data errors can be suppressed under an environment of severe mechanical shocks and vibrations in an airplane.

In order to attain the object, the present invention is a transmitting and receiving apparatus comprising: modulating means for modulating an input digital data; first frequency converting means for converting a signal output from said modulating means into a signal of a predetermined frequency; amplifying/branching means for amplifying and branching a signal output from said first frequency converting means; second frequency converting means for converting a signal output from said amplifying/branching means, into a signal of a predetermined frequency; and demodulating means for demodulating a digital data from a signal output from said second frequency converting means, wherein each of said first and second frequency converting means comprises a PLL frequency synthesizer, said demodulating means has a carrier recovery section, and natural angular frequencies of said PLL frequency synthesizers are set to be equal to a maximum frequency of mechanical vibrations which are externally applied, or in a predetermined width above and below the maximum frequency, or a loop filter bandwidth of said carrier recovery section is set to be higher by a predetermined amount than the maximum frequency of mechanical vibrations which are externally applied.

According to this configuration, even when mechanical shocks or vibrations in an airplane are applied to the transmitting and receiving apparatus, the PLL frequency synthesizers and the carrier recovery section rapidly follow changes due to the application, thereby suppressing noises. Therefore, it is possible to prevent erroneous data from being output from the demodulating means.

LEGEND OF THE REFERENCE NUMERALS

Figure 1:
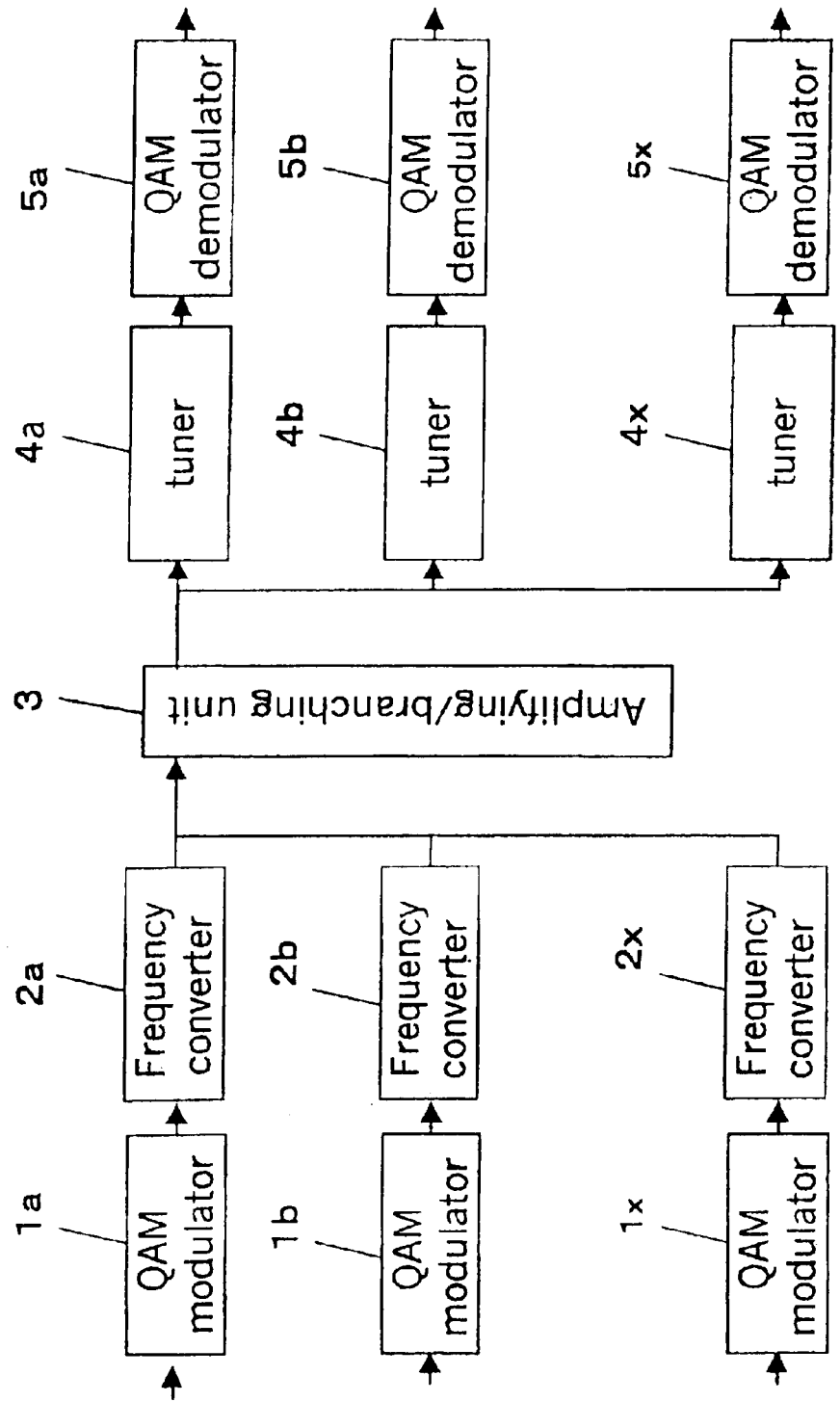
FIG. 1 is a diagram showing the configuration of a transmitting and receiving apparatus of Embodiment 1 of the invention.

The reference numeral 1a to 1x denote QAM modulators, 2a to 2x denote frequency converters, 3 denotes an amplifying/branching unit, 4a to 4x denote tuners, 5a to 5x denote QAM demodulators, 21 denotes a PLL synthesizer IC, 22 denotes a loop filter, 23 denotes a voltage controlled oscillator, 24 denotes an amplifying IC, 25 denotes a branch coil, C1 to C6 denote capacitors, L denotes a coil, 31 denotes an A/D conversion section, 32 denotes a quadrature detection section, 33 denotes a modulating component removal section, 34 denotes a digital filter section, 35 denotes an oscillation section, 41 denotes a printed circuit board, 42 denotes a microstrip line, 43 denotes a grounding conductor, 44 denotes a sheathing resin, 45 denotes a reinforcing plate, 46 denotes an adhesive agent, 51 denotes a printed circuit board, 52 denotes a microstrip line, 53 denotes a grounding conductor, 54 denotes a sheathing resin, 55 denotes a shield cover, 61 denotes modulating means, 62 denotes first frequency converting means, 63 denotes amplifying/branching means, 64 denotes second frequency converting means, 65 denotes demodulating means, 71 denotes a PLL synthesizer IC, 72 denotes a loop filter, 73 denotes a voltage controlled oscillator, and 74 denotes a crystal oscillator.

DESCRIPTION OF THE PREFERRED EMBODIMENTS (Embodiment 1)

FIG. 1 shows the configuration of a transmitting and receiving apparatus of Embodiment 1 of the invention. In FIG. 1, 1a to 1x denote QAM modulators, 2a to 2x denote frequency converters, 3 denotes an amplifying/branching unit, 4a to 4x denote tuners, and 5a to 5x denote QAM demodulators.

The operation of the thus configured transmitting and receiving apparatus will be described with reference to FIG. 1.

First, MPEG transport streams TSa to TSx of a rate of 41.34 Mbps are input to the QAM modulators 1a to 1x, respectively. An MPEG transport stream is a data string which is considered to be used in communication, has enhanced resistance to a transmission error and a program multiplexing function, and is used in the unit of a fixed-length packet of 188 bytes. The structure of such a packet is described in detail in, for example, "MPEG SYSTEM FOR MULTIPLYING MULTIMEDIA" at page 231 of "SAISIN MPEG KYOKASHO" (1994, ASCII SHUPPANKYOKU).

Each of the QAM modulators 1a to 1x outputs a 64-QAM modulated wave of a center frequency of 36.125 MHz. The signals output from the QAM modulators 1a to 1x are input to the frequency converters 2a to 2x, respectively. Each of the frequency converters 2a to 2x has an internal PLL frequency synthesizer, and outputs a signal in which the center frequency of the input signal is converted. In the embodiment, the frequency converter 2a outputs a signal of 141 MHz, the frequency converter 2b outputs a signal of 149 MHz, and the frequency converter 2x outputs a signal of 325 MHz. All the output signals are arranged at intervals of 8 MHz so as not overlap with one another on the frequency axis. The signals output from the frequency converters 2a to 2x are input to the amplifying/branching unit 3.

The amplifying/branching unit 3 amplifies and branches the input signals, and outputs the amplified and branched signals. The signals output from the amplifying/branching unit 3 are input to the tuners 4a to 4x. Each of the tuners 4a to 4x has an internal PLL frequency synthesizer, selects one of the input signals, and converts the center frequency to 36.125 MHz. In the embodiment, the tuner 4a selects the signal of 141 MHz, the tuner 4b selects the signal of 149 MHz, and the tuner 4x selects the signal of 325 MHz. The tuners convert the frequencies of the selected signals to 36.125 MHz.

The signals output from the tuners 4a to 4x are input to the QAM demodulators 5a to 5x, respectively. Each of the QAM demodulators 5a to 5x demodulates the input signal and outputs a reproduced data of a rate of 41.34 Mbps.

Figure 2:
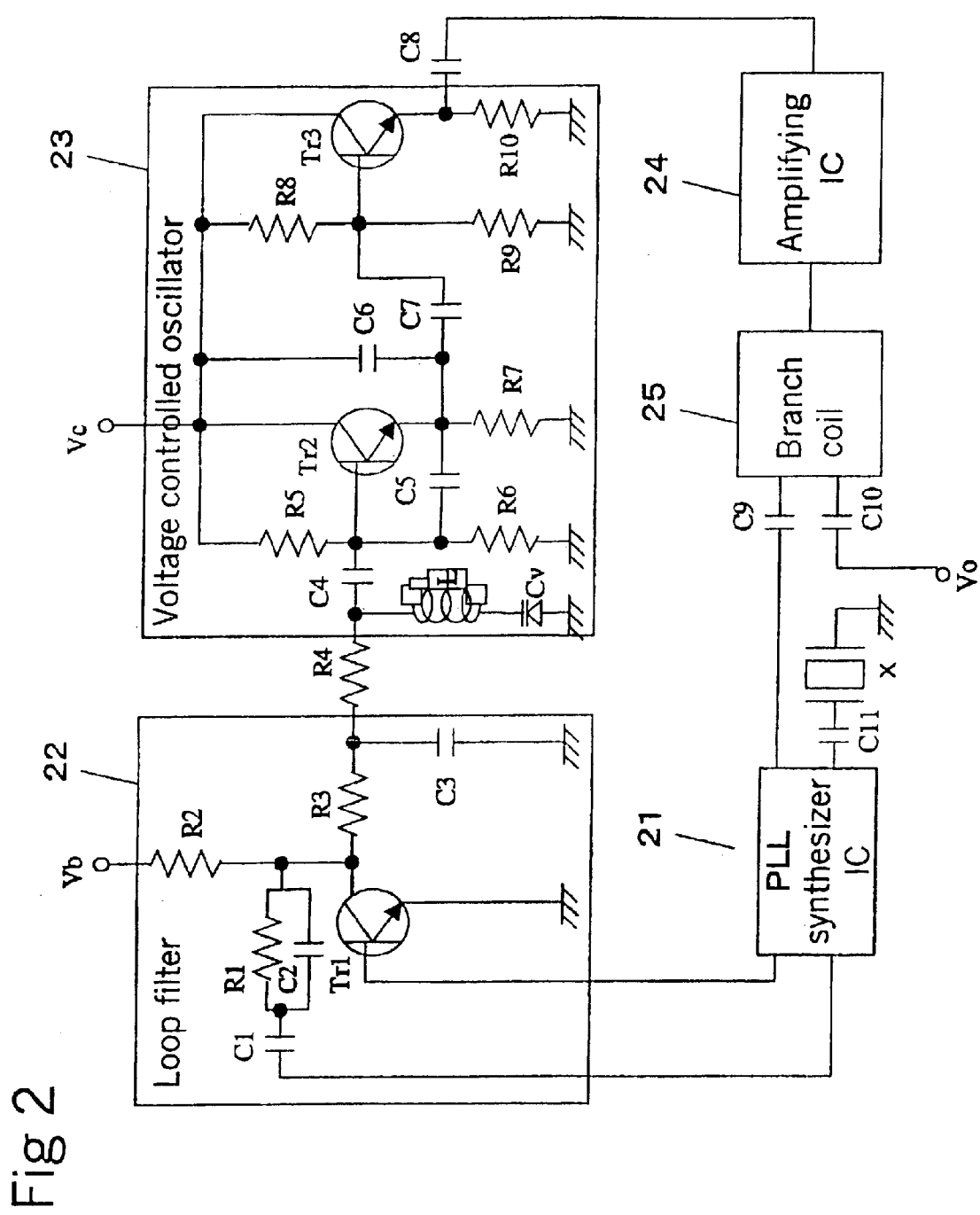
FIG. 2 is a diagram showing the configuration of a PLL frequency synthesizer included in each of frequency converters and tuners of FIG. 1.

FIG. 2 shows the configuration of the PLL frequency synthesizer included in each of the frequency converters 2a to 2x and the tuners 4a to 4x. In FIG. 2, 21 denotes a PLL synthesizer IC, 22 denotes a loop filter, 23 denotes a voltage controlled oscillator, 24 denotes an amplifying IC, 25 denotes a branch coil, R1 to R10 denote resistors, C1 to C11 denote capacitors, L denotes a coil, Tr1 to Tr3 denote transistors, and X denotes a crystal oscillator.

Hereinafter, the operation of the PLL frequency synthesizer will be described with reference to FIG. 2.

A signal output from the PLL synthesizer IC 21 is input to the loop filter 22. The loop filter 22 is configured by: a first integration section consisting of the capacitors C1 and C2 and the resistor R1; a voltage level shift section consisting of the resistor R2 and a transistor Tr1; and a second integration section consisting of the resistor R3 and the capacitor C3.

The loop filter 22 performs smoothing of the signal output from the PLL synthesizer IC 21, and a level shift based on a DC voltage Vb. A signal output from the loop filter 22 is input to the voltage controlled oscillator 23 via the resistor R4.

The voltage controlled oscillator 23 is configured by: an oscillation section consisting of the resistors R5 to R7, the capacitors C4 to C6, a variable capacitor Cv, the coil L, and the transistor Tr2; and a buffer section consisting of the resistors R8 to R10 and the transistor Tr3.

In the voltage controlled oscillator 23, the capacitance of the variable capacitor Cv is changed in accordance with the voltage level of the signal output from the loop filter 22, and a signal of a frequency corresponding to the change of the capacitance is output. The signal output from the voltage controlled oscillator 23 is input to the amplifying IC 24 via the capacitor C8.

The amplifying IC 24 amplifies the input signal by a constant factor. A signal output from the amplifying IC 24 is input to the branch coil 25. The branch coil 25 branches the signal output from the amplifying IC 24 into two signal portions. One of the signal portions is output to the PLL synthesizer IC 21 via the capacitor C9, and the other signal portion is output as an output signal Vo of the PLL frequency synthesizer via the capacitor C10.

Figure 3:
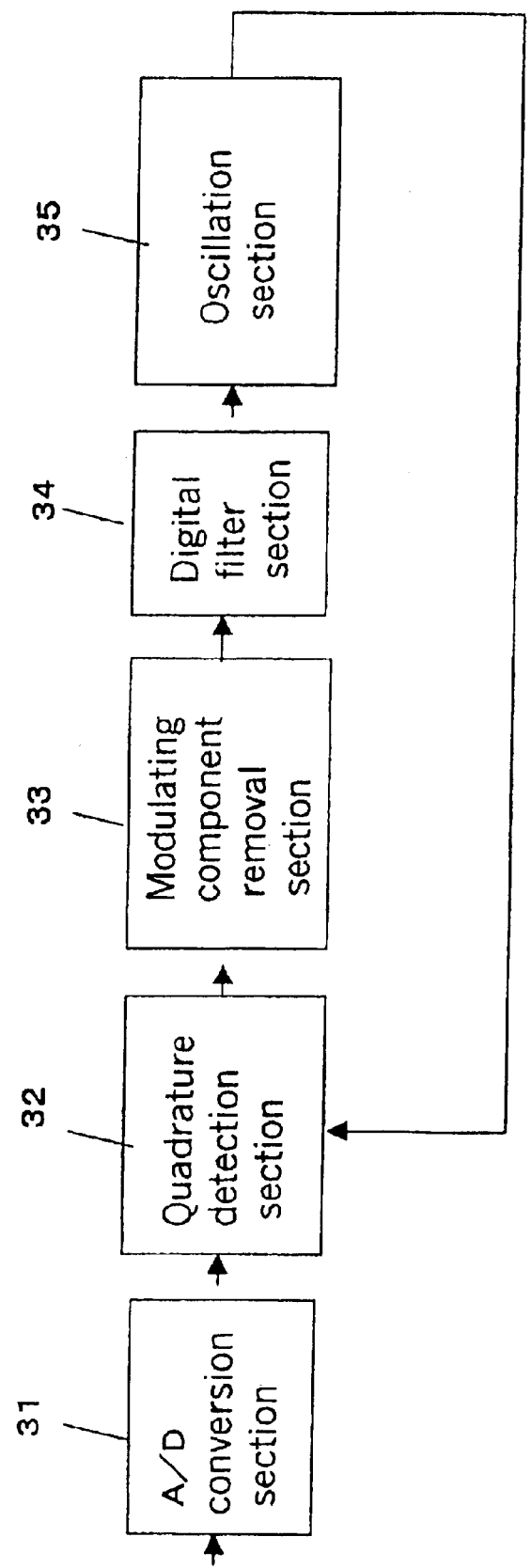
FIG. 3 is a diagram showing the configuration of a carrier recovery section included in each of QAM demodulators of FIG. 1.

FIG. 3 shows the configuration of a carrier recovery section included in each of the QAM demodulators. In FIG. 3, 31 denotes an A/D conversion section, 32 denotes a quadrature detection section, 33 denotes a modulating component removal section, 34 denotes a digital filter section, and 35 denotes an oscillation section.

Hereinafter, the operation of the carrier recovery section will be described with reference to FIG. 3.

The A/D conversion section 31 converts an analog signal input to the corresponding QAM demodulator into a digital signal. A data output from the A/D conversion section 31 is input to the quadrature detection section 32. The quadrature detection section 32 performs quadrature detection on the data output from the A/D conversion section 31, by using a data output from the oscillation section 35, to produce I- and Q-axis data.

The two data output from the quadrature detection section 32 are input to the modulating component removal section 33. The modulating component removal section 33 removes modulating components from the I- and Q-axis data to produce carrier components. A data output from the modulating component removal section 33 is input to the digital filter section 34.

The digital filter section 34 has a frequency characteristic of allowing only a signal of a low frequency region to pass therethrough, and smoothes the input data to remove noise components. A data output from the digital filter section 34 is input to the oscillation section 35.

The oscillation section 35 produces sinusoidal and cosinusoidal wave data from the input data. When the carrier recovery section is configured as described above, the sinusoidal and cosinusoidal wave data output from the oscillation section 35 coincide with the carrier components contained in the QAM modulated wave input to the A/D conversion section 31.

When severe mechanical shocks and vibrations in an airplane are applied to the transmitting and receiving apparatus, noise components contained in the output signals of the PLL frequency synthesizers included in the frequency converters 2a to 2x and the tuners 4a to 4x are increased, and therefore the QAM demodulators 5a to 5x output erroneous reproduced data.

Generally, vibrations which are applied to a transmitting and receiving apparatus in an airplane are variously changed in accordance with the flying state of the airplane, such as the weather and the altitude, and the place in the airplane where the apparatus is disposed. According to standards for vibration resistance tests on the ground, such vibrations have a frequency in the range of 10 Hz to 2 kHz. This is described in, for example, "Vibration" of Section 8 of "DO-160 D/Environmental Condition and Test Procedures for Airborne Equipment" (1997, RTCA).

Therefore, mechanical vibrations in the frequency range are applied to the components constituting the PLL frequency synthesizer of FIG. 2. Namely the characteristics of the capacitors and coils included in the loop filter 22 and the voltage controlled oscillator 23 are changed by the mechanical vibrations (such changes are called microphonic noises).

In Embodiment 1 of the invention, data errors due to such mechanical vibrations are prevented from occurring in the QAM demodulators, in the following manner.

In the PLL frequency synthesizer of FIG. 2, first, the natural angular frequency $\omega 0$ is set to be in the vicinity of the maximum frequency of 2 kHz of mechanical vibrations.

As described in "TV/Satellite Synthesisers Basic Design Guidelines" of Section 6 of "Media IC Handbook" (1995, GEC PLESSEY), the natural angular frequency $\omega 0$ is expressed by the following expressions by using the resistor R1, the capacitors C1 and C2, the gain Kd of a phase comparator 21, the gain Ko of the voltage controlled oscillator 23, the frequency division ratio P of a prescaler divider in the phase comparator 21, the frequency division ratio N of a programmable divider in the phase comparator 21, and a damping factor $\zeta$.

$C1 = Kd \cdot Ko/(P \cdot N \; \omega 0^2)$ [Ex. 1]

$R1' = 2 \cdot \zeta/(\omega 0 \cdot C1)$ [Ex. 2]

$R1' = (1 + C2/C1) \cdot R1$ [Ex. 3]

$C2 = C1/C5$ [Ex. 4]

In the embodiment, R1'=3.9 k$\Omega$, C1=47 nF, C2=12 nF, Kd=150 uA/2 $\pi$, Ko=15 MHz/V, P=1, N=621 to 805 variable in the unit of 1 step, and $\zeta$=0.8. As a result, the natural angular frequency is set to about 8 krad/sec (about 1.3 kHz).

The crystal oscillator X of 4 MHz is externally connected to the PLL synthesizer IC, and the phase comparison sampling frequency is set to 1 MHz.

Figure 10:
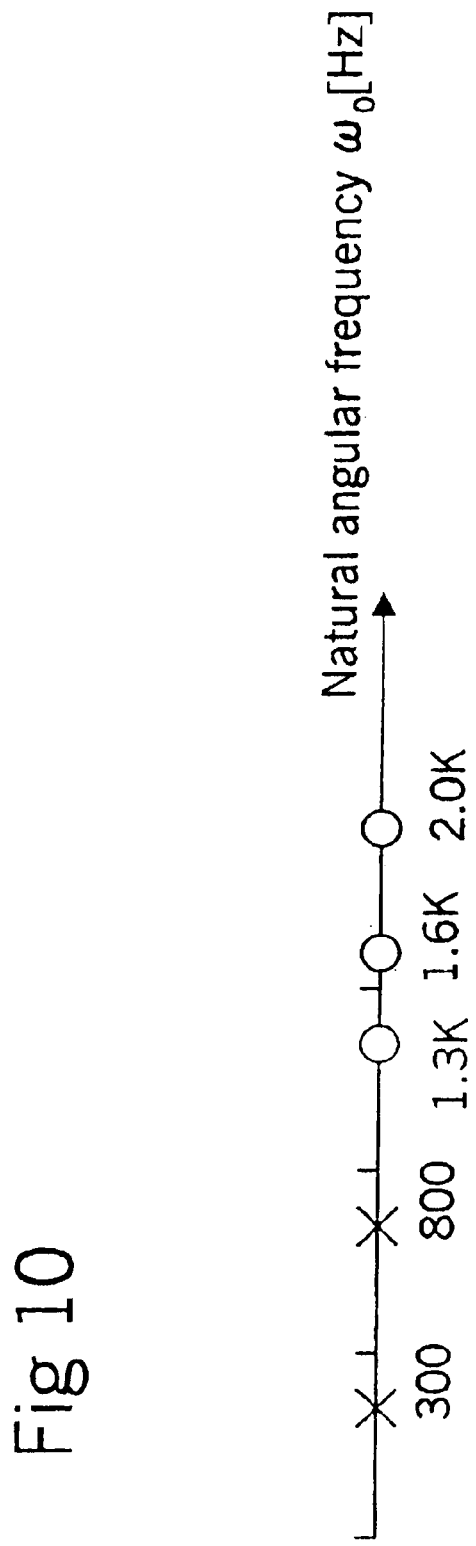
FIG. 10 is a diagram showing a state of occurrence of a data error with respect to a natural angular frequency $\omega 0$.

FIG. 10 shows a state of occurrence of a data error with respect to the natural angular frequency $\omega 0$. The mark ○ indicates a case where, even when mechanical vibrations are applied, a resulting data error of the QAM demodulator is allowable, and the mark X indicates a case where a resulting data error is not allowable.

When the natural angular frequency is set to be in the vicinity of the maximum frequency of 2 kHz of mechanical vibrations as described above, it is seen that, even when the characteristics of the capacitors and coils included in the loop filter 22 and the voltage controlled oscillator 23 are changed by the mechanical vibrations in the range of 10 Hz to 2 kHz, the PLL frequency synthesizers and the carrier recovery sections can rapidly follow changes to suppress generation of noises.

Figure 11:
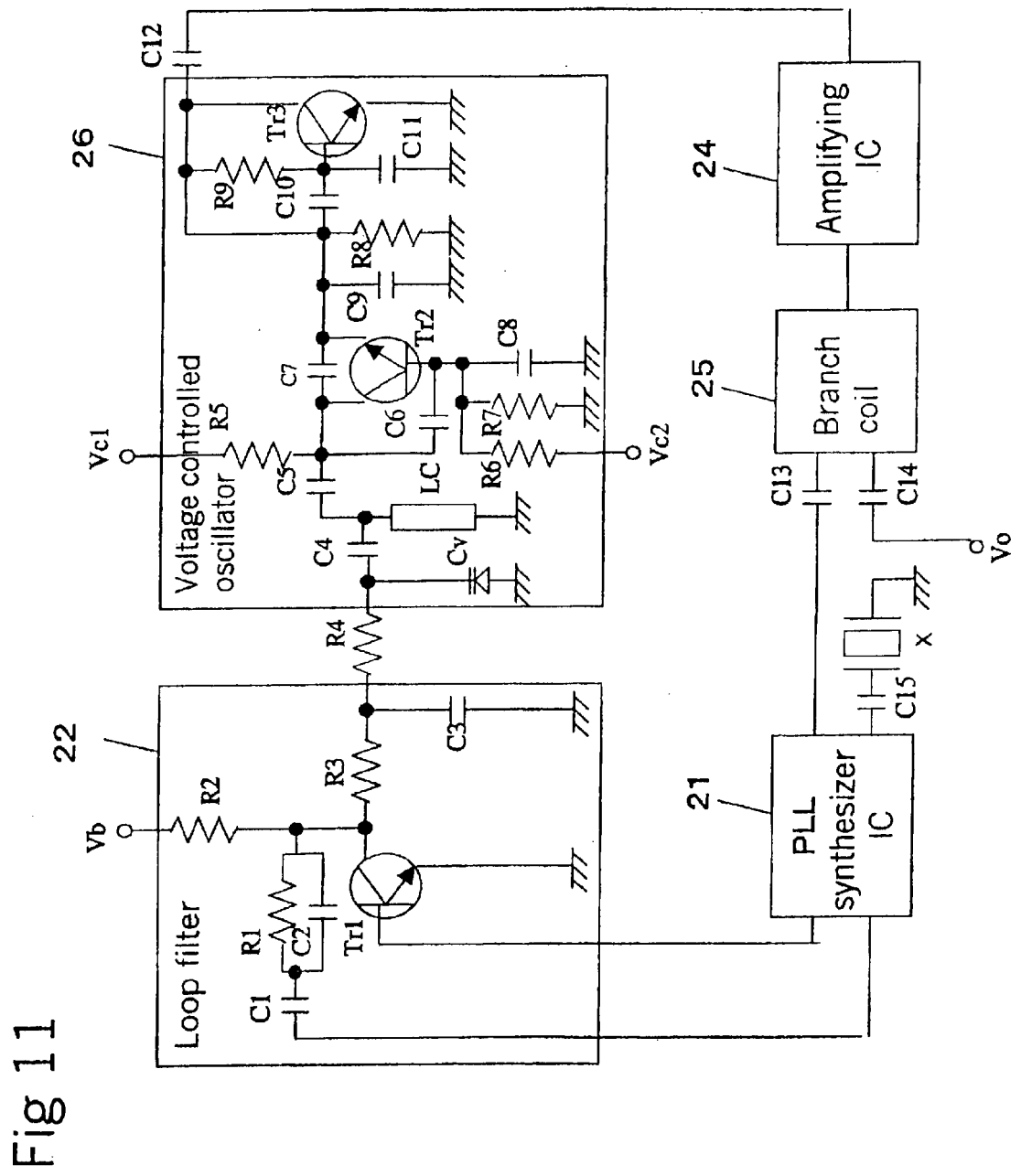
FIG. 11 is a diagram showing the configuration of another PLL frequency synthesizer.

FIG. 11 shows the configuration of another PLL frequency synthesizer. In FIG. 11, 21 denotes a PLL synthesizer IC, 22 denotes a loop filter, 26 denotes a voltage controlled oscillator, 24 denotes an amplifying IC, 25 denotes a branch coil, R1 to R6 denote resistors, C1 to C15 denote capacitors, LC denotes a resonance circuit, Tr1 to Tr3 denote transistors, and X denotes a crystal oscillator.

Also in this case, when the natural angular frequency is set to be in the vicinity of the maximum frequency of 2 kHz of mechanical vibrations, it has been seen that, even when the characteristics of the capacitors and coils included in the loop filter 22 and the voltage controlled oscillator 23 are changed by the mechanical vibrations in the range of 10 Hz to 2 kHz, the PLL frequency synthesizers and the carrier recovery sections can rapidly follow changes to suppress generation of noises. In the description, the setting to the vicinity of 2 kHz means a range of +50% with respect the maximum frequency.

In the carrier recovery section of FIG. 3, next, the loop bandwidth is set to be sufficiently higher than 2 kHz which is the maximum frequency of mechanical vibrations.

The loop bandwidth is determined by the configuration and the operating frequency of the digital filter 34. This is described by WILLIAM et al. in, for example, p. 426 of "A Survey of Digital Phase-Locked Loops" (1981, Proceeding of the IEEE, Vol. 69, No. 4).

In the embodiment, the digital filter 34 is configured to be of the secondary type, and the operating rate is set to an integer multiple of the symbol rate, so that the loop bandwidth is set to about 15 kHz.

Figure 12:
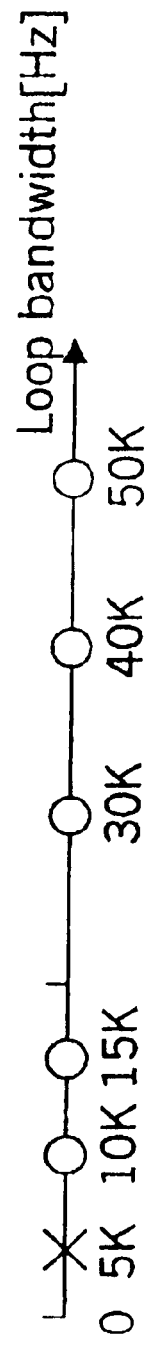
FIG. 12 is a diagram showing a state of occurrence of a data error with respect to a loop bandwidth.

FIG. 12 is a diagram showing a state of occurrence of a data error with respect to the loop bandwidth. The mark ○ indicates a case where, even when mechanical vibrations are applied, a resulting data error of the QAM demodulator is allowable, and the mark X indicates a case where a resulting data error is not allowable.

In the case where the loop bandwidth is set to be sufficiently higher than the maximum frequency of 2 kHz of mechanical vibrations as described above, even when noises in the signals output from PLL frequency synthesizers are increased, the carrier recovery sections can rapidly follow changes to prevent a data error from being generated. The sufficiently higher setting means that the loop bandwidth is higher than the maximum frequency by at least 5 kHz.

As described above, according to Embodiment 1, in the transmitting and receiving apparatus comprising: the QAM modulators 1a to 1x which modulate an input digital data; the frequency converters 2a to 2x which convert signals respectively output from the QAM modulators 1a to 1x into signals of predetermined frequencies; the amplifying/branching unit 3 which amplifies and branches signals output from the frequency converters 2a to 2x; the tuners 4a to 4x which respectively convert signals output from the amplifying/branching unit 3, into signals of a predetermined frequency; and the QAM demodulators 5a to 5x which demodulate digital data from signals output from the tuners 4a to 4x, each of the frequency converters 2a to 2x and the tuners 4a to 4x comprises a PLL frequency synthesizer, each of the QAM demodulators 5a to 5x comprises a carrier recovery section, the natural angular frequencies of the PLL frequency synthesizers are set to be in the vicinity of the maximum frequency of mechanical vibrations which are externally applied, and the loop bandwidths of the carrier recovery sections are set to be sufficiently higher than the maximum frequency of mechanical vibrations which are externally applied, whereby, even mechanical shocks and vibrations in an airplane are applied to the transmitting and receiving apparatus, the PLL frequency synthesizers and the carrier recovery sections are enabled to rapidly follow changes due to the application, thereby suppressing noises. Therefore, it is possible to prevent the QAM demodulators 5a to 5x from outputting erroneous data.

(Embodiment 2)

Hereinafter, Embodiment 2 of the invention will be described with reference to FIG. 2.

Embodiment 2 of the invention is identical with Embodiment 1 except that the coil L used in the resonance section of the voltage controlled oscillator 23 included in the PLL frequency synthesizer of FIG. 2 is configured by a microstrip line, and hence description of its operation is omitted. Hereinafter, the coil L configured by the microstrip line will be described.

Referring to FIG. 0.2, the oscillation frequency fvco of the signal output from the voltage controlled oscillator 23 is expressed by the following expressions.

$$fvco=1/(2 \cdot \pi \sqrt{K}) \qquad \text{[Ex. 5]}$$

$$K=L \cdot C5 \cdot C6 \cdot Cv \cdot (C5 \cdot C6 + Cv(C5+C6)) \qquad \text{[Ex. 6]}$$

When severe mechanical shocks and vibrations in an airplane are applied to the voltage controlled oscillator 23, the characteristics of the coils and the capacitors are changed and hence the oscillation frequency fvco is varied. As a result, noise components contained in the output signals of the PLL frequency synthesizers are increased, and therefore the QAM demodulators 5a to 5x output erroneous reproduced data.

In Expressions 5 and 6, when the coil L, the capacitor C5, the capacitor C6, and the variable capacitor Cv are changed by the same ratio, the coil L exerts the largest influence on the oscillation frequency fvco. Therefore, the coil L is configured by a microstrip line in which the characteristics are less changed by mechanical vibrations. When the coil L is configured to be of the air core type, its shape is easily changed by mechanical vibrations, and hence the characteristics are largely changed. The inductance of a microstrip line is described in, for example, page 172 of "MICROWAVE KAIRO NO KISO TO SONO OYO" (1990, SOGO DENSHI SHUPPANSHA).

When the coil L used in the resonance section of the voltage controlled oscillator 23 included in each of the PLL frequency synthesizers is configured by a microstrip line as described above, characteristic changes due to mechanical shocks and vibrations can be reduced to suppress frequency variations of the voltage controlled oscillator 23.

(Embodiment 3)

Hereinafter, Embodiment 3 of the invention will be described with reference to FIG. 4.

Embodiment 3 of the invention is identical with Embodiment 1 except that the coil L used in the resonance section of the voltage controlled oscillator 23 included in the PLL frequency synthesizer of FIG. 2 is configured by a microstrip line and a reinforcing plate is pasted to the upper side of the microstrip line, and hence description of its operation is omitted. Hereinafter, the configuration of the microstrip line will be described.

Figure 4:
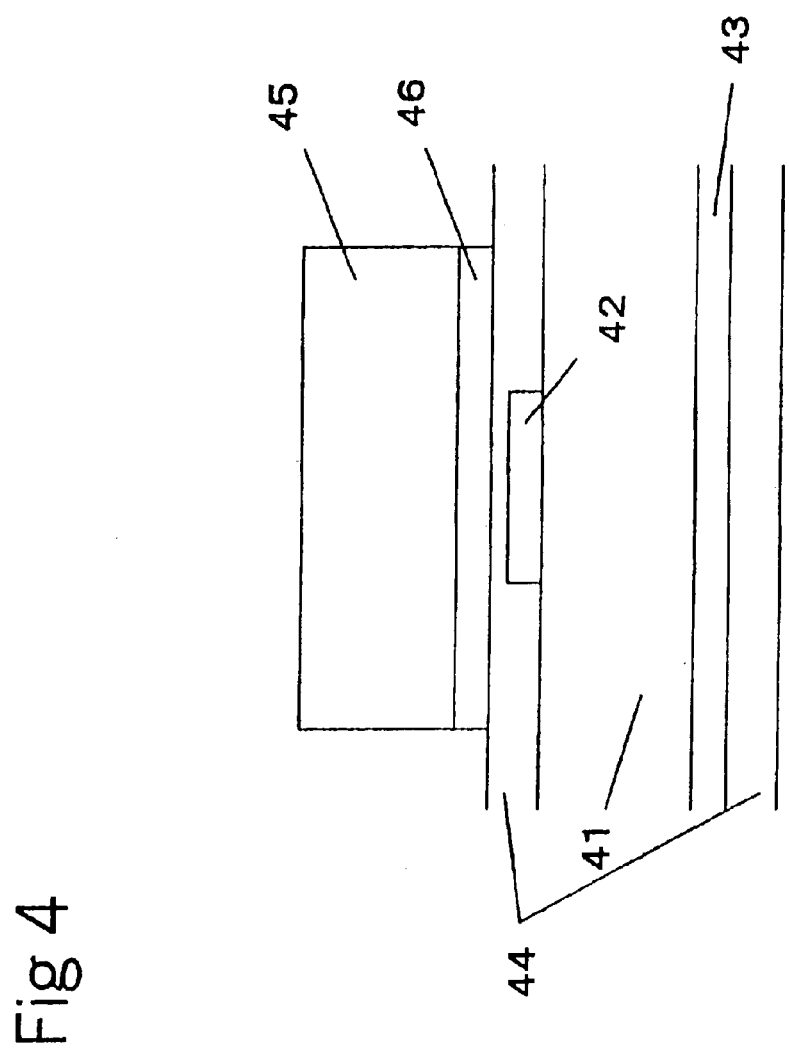
FIG. 4 is a section view of a microstrip line used in a PLL frequency synthesizer in Embodiment 3 of the invention.

FIG. 4 is a section view of the microstrip line and showing Embodiment 3 of the invention. In the figure, 41 denotes a printed circuit board, 42 denotes the microstrip line, 43 denotes a grounding conductor, and 44 denotes a sheathing resin. These components are configured in the same manner as those appearing in a section of a microstrip line of the prior art. Unlike the prior art, an adhesive agent 46 is applied to the reinforcing plate 45 and the reinforcing plate is pasted to the upper side of the microstrip line 42.

The operation of the thus configured microstrip line will be described.

When severe mechanical shocks and vibrations in an airplane are applied to the microstrip line 42 formed on the printed circuit board 41, the printed circuit board 41, the microstrip line 42, and the grounding conductor 43 are deformed, and characteristics of the microstrip line are changed. This change in characteristics causes the oscillation frequency fvco of the voltage controlled oscillator 23 to be varied.

As a result, noise components contained in the output signals of the PLL frequency synthesizers are increased, and therefore the QAM demodulators 5a to 5x output erroneous reproduced data. In order to enhance the mechanical strength of the vicinity of the microstrip line 42, therefore, the reinforcing plate 45 is pasted to the upper side of the microstrip line 42.

The reinforcing plate 45 is a board which is made of the same material as the printed circuit board 41. As the adhesive agent 46, used is an epoxy or silicone adhesive agent having excellent insulating properties, or a double-coated adhesive tape having excellent insulating properties.

According to this configuration, the reinforcing plate 45 functions as a reinforcing member against mechanical shocks and vibrations, and hence the change in characteristics of the microstrip line can be suppressed.

When a reinforcing plate is pasted to the upper side of a microstrip line used in the resonance section of the voltage controlled oscillator 23 included in each of the PLL frequency synthesizers as described above, characteristic changes due to mechanical shocks and vibrations can be reduced to suppress frequency variations of the voltage controlled oscillator 23.

(Embodiment 4)

Hereinafter, Embodiment 4 of the invention will be described with reference to FIG. 9.

Embodiment 4 of the invention is identical with Embodiment 1 except that the coil L used in the resonance section of the voltage controlled oscillator 23 included in the PLL frequency synthesizer of FIG. 2 is configured to be of the chip surface mount type, and hence description of its operation is omitted. Hereinafter, the coil L which is configured to be of the chip surface mount type will be described.

Figure 9:
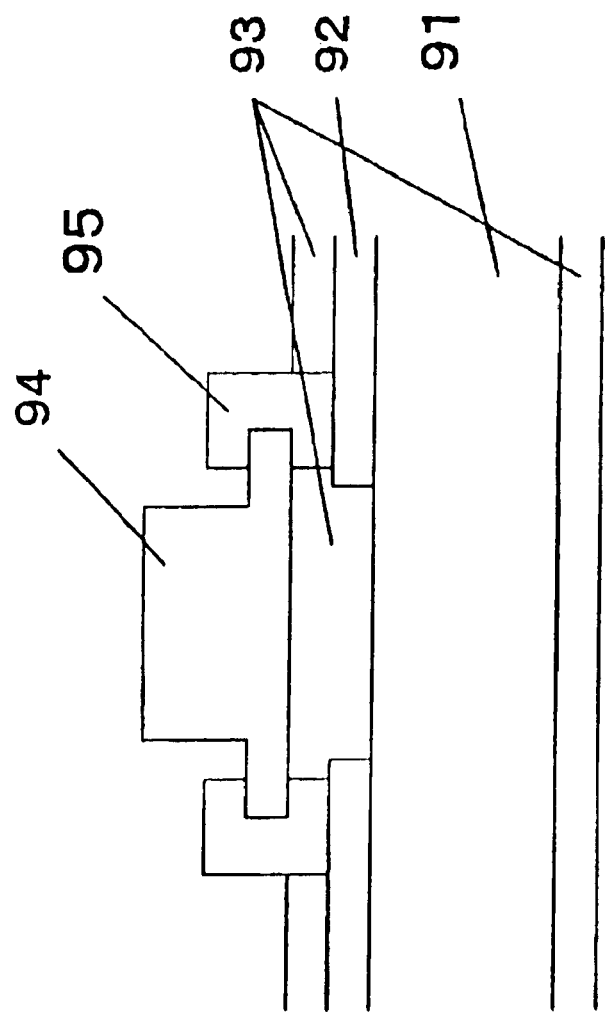
FIG. 9 is a section view of a vicinity of a coil of the chip surface mount type and showing Embodiment 4 of the invention.

FIG. 9 is a section view of a vicinity of a coil of the chip surface mount type and showing Embodiment 4 of the invention. In the figure, 91 denotes a printed circuit board, 92 denotes a conductor pattern, 93 denotes a sheathing resin, 94 denotes a chip surface mount type coil, and 95 denotes solder. The conductor pattern 92 formed on the printed circuit board 91 is covered with the sheathing resin 93 except a portion to which the chip surface mount type coil 94 is to be soldered.

The operation of the thus configured chip surface mount type coil will be described.

When severe mechanical shocks and vibrations in an airplane are applied to the voltage controlled oscillator 23, the characteristics of the coils and the capacitors are changed and hence the oscillation frequency fvco is varied. As a result, noise components contained in the output signals of the PLL frequency synthesizers are increased, and therefore the QAM demodulators 5a to 5x output erroneous reproduced data.

As described in Embodiment 2, in Expressions 5 and 6, when the coil L, the capacitor C5, the capacitor C6, and the variable capacitor Cv are changed by the same ratio, the coil L exerts the largest influence on the oscillation frequency fvco.

Therefore, the coil L is configured by a coil of the chip surface mount type in which a less stress is produced by mechanical vibrations. When the coil L is configured to be of the air core type, its shape is easily changed by mechanical vibrations, and hence the characteristics are largely changed. By contrast, a chip surface mount type coil is substantially equal in size to a chip type capacitor or resistor, and a mechanical stress is hardly transmitted from a printed circuit board to the coil.

When the coil L used in the resonance section of the voltage controlled oscillator 23 included in each of the PLL frequency synthesizers is configured to be of the chip surface mount type as described above, characteristic changes due to mechanical shocks and vibrations can be reduced to suppress frequency variations of the voltage controlled oscillator 23.

(Embodiment 5)

Hereinafter, Embodiment 5 of the invention will be described with reference to FIG. 5.

Embodiment 5 of the invention is identical with Embodiment 1 except that the coil L used in the resonance section of the voltage controlled oscillator 23 included in the PLL frequency synthesizer of FIG. 2 is configured by a microstrip line and the microstrip line is formed by an inner layer of a printed circuit board, and hence description of its operation is omitted. Hereinafter, the configuration of the microstrip line will be described.

Figure 5:
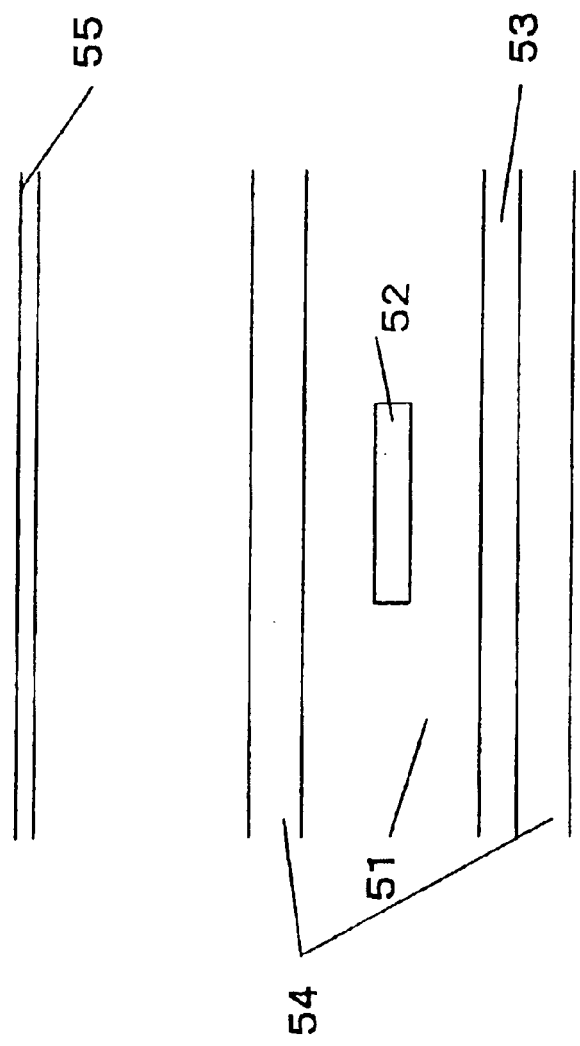
FIG. 5 is a section view of a microstrip line used in a PLL frequency synthesizer in Embodiment 5 of the invention.
Figure 6:
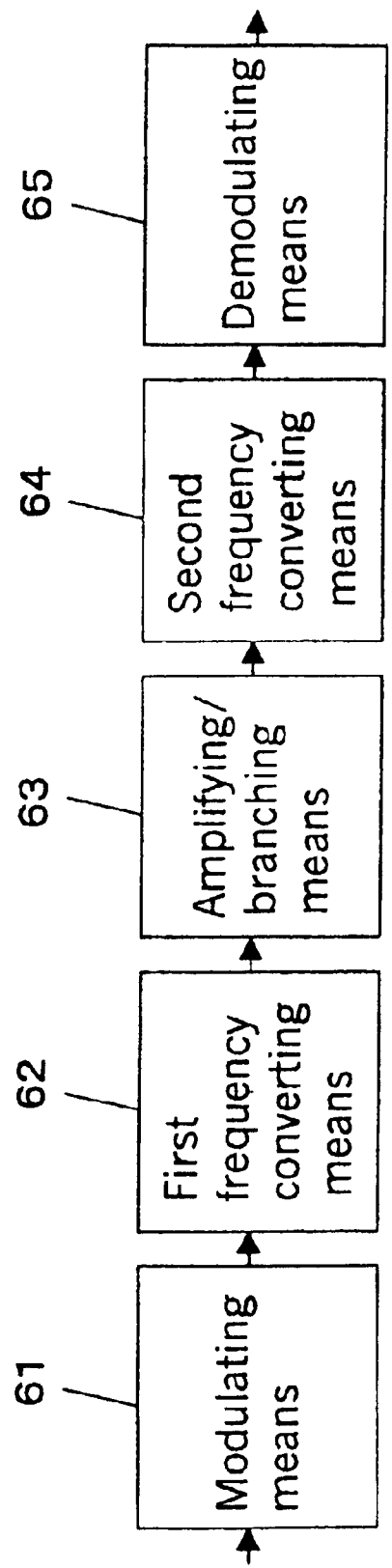
FIG. 6 is a diagram of a transmitting and receiving apparatus of the prior art.
Figure 7:
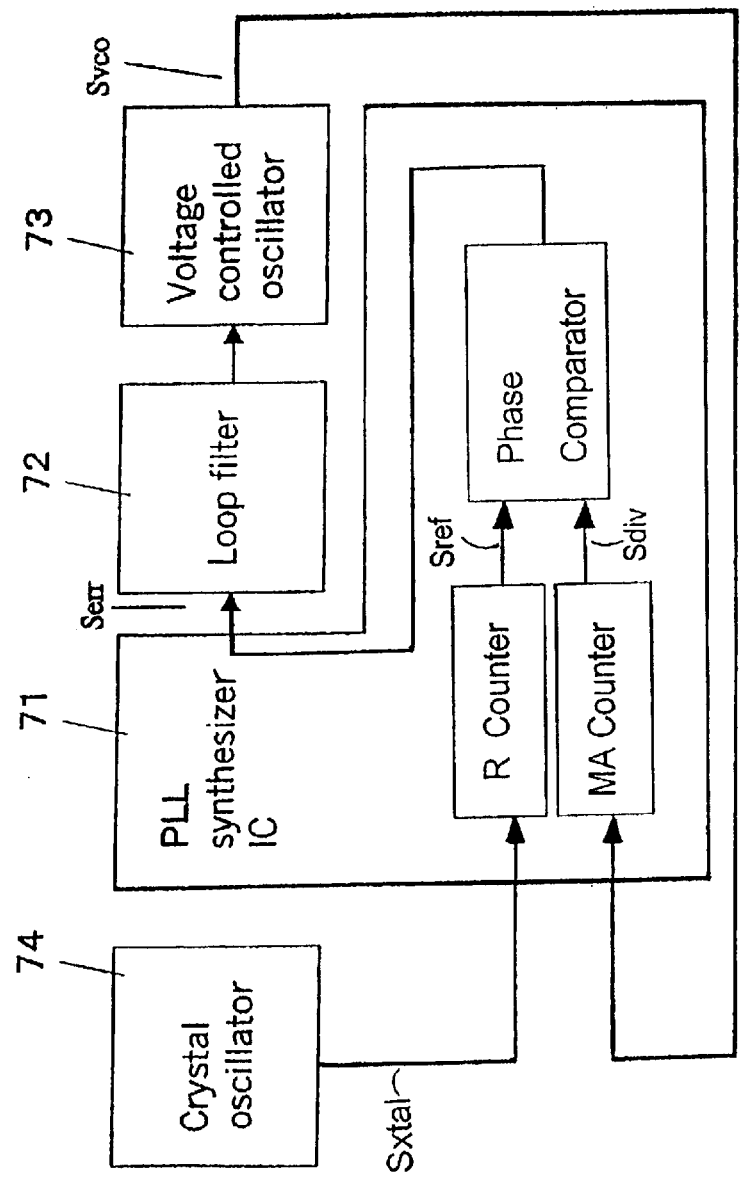
FIG. 7 is a diagram showing the configuration of a PLL frequency synthesizer included in first and second frequency converting means of FIG. 6.

FIG. 5 is a section view of the microstrip line and showing Embodiment 5 of the invention. In the figure, 51 denotes the printed circuit board, 52 denotes the microstrip line, 53 denotes a grounding conductor, 54 denotes a sheathing resin, and 55 denotes a shield cover. The microstrip line 52 is different from a prior art one in that the microstrip line is formed inside the printed circuit board.

The operation of the thus configured microstrip line will be described.

In order to prevent signals from the PLL frequency synthesizers from leaking to the outside, and conversely an external signal from entering the PLL frequency synthesizers, the shield cover 55 is attached to the printed circuit board 51. When the microstrip line 52 is formed in an outer layer of the printed circuit board 51, severe mechanical shocks and vibrations in an airplane cause spatial conditions with respect to the shield cover 55 to be varied, and hence characteristics of the microstrip line are changed. This change in characteristics causes the oscillation frequency fvco of the voltage controlled oscillator 23 to be varied. As a result, noise components contained in the output signals of the PLL frequency synthesizers are increased, and therefore the QAM demodulators 5a to 5x output erroneous reproduced data.

In the embodiment, as shown in FIG. 5, the microstrip line 52 is formed in an internal layer of the printed circuit board 51, so that the microstrip line 52 is not directly opposed to the shield cover 55 attached to the printed circuit board 51. According to this configuration, a part of the printed circuit board 51 is interposed between the microstrip line 52 and the shield cover 55, and hence variations of spatial conditions due to mechanical shocks and vibrations can be reduced.

When a microstrip line used in the resonance section of the voltage controlled oscillator 23 included in each of the PLL frequency synthesizers is formed by an internal layer of a printed circuit board as described above, characteristic changes due to mechanical shocks and vibrations can be reduced to suppress frequency variations of the voltage controlled oscillator 23.

(Embodiment 6)

Hereinafter, Embodiment 6 of the invention will be described with reference to FIG. 2.

Embodiment 6 of the invention is identical with Embodiment 1 except that the capacitors C1, C2, and C3 used in the loop filter 22, and the capacitors C4, C5, and C6 used in the resonance section of the voltage controlled oscillator 23 which are included in the PLL frequency synthesizer of FIG. 2 are configured to be of the film type, and hence description of its operation is omitted. Hereinafter, the capacitors of the film type will be described.

When severe mechanical shocks and vibrations in an airplane are applied to the loop filter 22 and the voltage controlled oscillator 23 of the PLL frequency synthesizer, the characteristics of the coils and the capacitors are changed and hence the oscillation frequency fvco is varied. As a result, noise components contained in the output signal of the PLL frequency synthesizer is increased, and therefore the QAM demodulators 5a to 5x output erroneous reproduced data.

As described in Embodiment 2, the loop filter 22 is configured by: the first integration section consisting of the capacitors C1 and C2 and the resistor R1; the voltage level shift section consisting of the resistor R2 and the transistor Tr1; and the second integration section consisting of the resistor R3 and the capacitor C3, and performs smoothing of the signal output from the PLL synthesizer IC 21, and a level shift based on the DC voltage Vb. As the capacitors C1 to C3, capacitors of the ceramic type are used in view of the high-frequency characteristics and size.

The voltage controlled oscillator 23 is configured by: the oscillation section consisting of the resistors R5 to R7, the capacitors C4 to C6, the variable capacitor Cv, the coil L, and the transistor Tr2; and the buffer section consisting of the resistors R8 to R10 and the transistor Tr3. In accordance with the signal output from the loop filter 22, the oscillator outputs the signal of the oscillation frequency fvco indicated by Expressions 5 and 6. As the capacitors C1 to C6, capacitors of the ceramic type are used in view of the high-frequency characteristics and size. A capacitor of the ceramic type has a drawback that, as compared with one of the film type, the piezoelectric effect is large and easily affected by mechanical shocks and vibrations.

Therefore, the capacitors C1 to C3 used in the loop filter 22, and the capacitors C4 to C6 used in the resonance section of the voltage controlled oscillator 23 are configured to be of the film type. As compared with a ceramic type capacitor, although large in size, a capacitor of the film type is excellent all in high-frequency, temperature, and vibration resistance characteristics.

When the capacitors C1 to C3 used in the loop filter 22, and the capacitors C4 to C6 used in the resonance section of the voltage controlled oscillator 23 are configured to be of the film type as described above, characteristic changes due to mechanical shocks and vibrations can be reduced to suppress frequency variations of the voltage controlled oscillator 23.

(Embodiment 7)

Hereinafter, Embodiment 7 of the invention will be described with reference to FIG. 8.

Embodiment 7 of the invention is identical with Embodiment 3 except that a rubber member is pasted to the upper side of the reinforcing plate of FIG. 4, and hence description of its operation is omitted. Hereinafter, the rubber member will be described.

Figure 8:
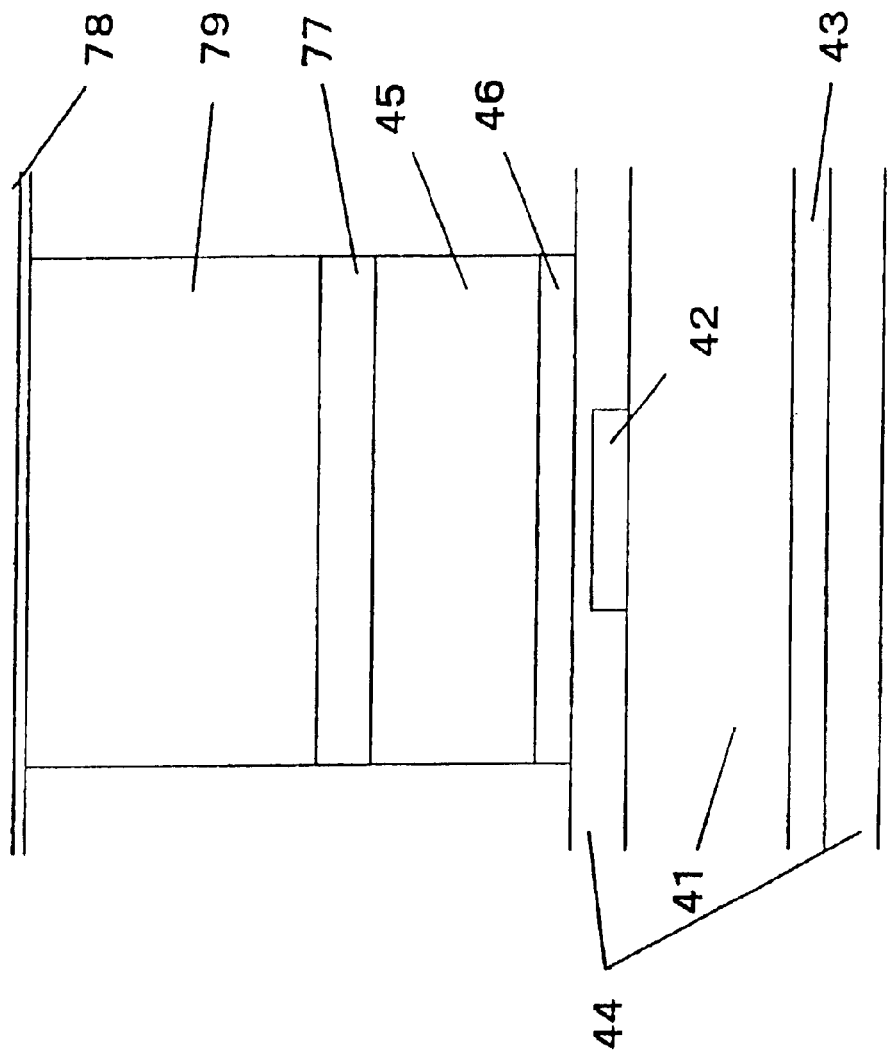
FIG. 8 is a section view of a microstrip line and showing Embodiment 7 of the invention.

FIG. 8 is a section view of the microstrip line and showing Embodiment 7 of the invention. In the figure, 41 denotes the printed circuit board, 42 denotes the microstrip line, 43 denotes the grounding conductor, 44 denotes the sheathing resin, 45 denotes the reinforcing plate, and 46 denotes the adhesive agent. These components are configured in the same manner as those appearing in the section of the microstrip line of Embodiment 3, and are denoted by the identical reference numerals. The embodiment is different from Embodiment 3 in that an adhesive agent 77 is applied to the upper side of the reinforcing plate 45 and a rubber member 79 is inserted between the reinforcing plate and a shield cover 78.

The operation of the thus configured microstrip line will be described.

As described in Embodiment 5, in order to prevent signals from the PLL frequency synthesizers from leaking to the outside, and conversely an external signal from entering the PLL frequency synthesizers, the shield cover 78 is attached to the printed circuit board 41.

When severe mechanical shocks and vibrations in an airplane are applied to the printed circuit board 41, the shield cover 78 resonates, and characteristics of the microstrip line and the capacitors which are covered by the t cover are changed. This change in characteristics increases noise components contained in the output signals of the PLL frequency synthesizers, and the QAM demodulators 5a to 5x output erroneous reproduced data.

In order to prevent the shield cover 78 from resonating, therefore, the rubber member 79 is inserted between the reinforcing plate 45 and the shield cover 78 by using the adhesive agent 77. According to this configuration, the rubber member 79 functions as a member for absorbing mechanical shocks and vibrations, so as to prevent the shield cover 78 from resonating, whereby the change in characteristics of the microstrip line and the capacitors can be suppressed.

When the rubber member 79 is inserted between the reinforcing plate 45 and the shield cover 78 which are disposed on the microstrip line used in the resonance section of the voltage controlled oscillator 23 included in each of the PLL frequency synthesizers as described above, characteristic changes due to mechanical shocks and vibrations can be reduced, and noises of the PLL frequency synthesizers can be suppressed.

In Embodiment 1, the numbers of the QAM modulators, the frequency converters, the tuners, and the QAM demodulators are a to x or 24. Alternatively, the numbers may not be 24, and the numbers of the QAM modulators and the frequency converters may not be equal to those of the tuners and the QAM demodulators.

In Embodiment 1, the MPEG transport streams of a rate of 41.34 Mbps are input to the QAM modulators 1a to 1x, and the modulators output 64-QAM modulated waves of a center frequency of 36.125 MHz. The rate of the MPEG transport streams, and the center frequency and modulation method of the output signals are not restricted to the above.

In Embodiment 1, the frequency converter 2a outputs the signal of 141 MHz, the frequency converter 2b outputs the signal of 149 MHz, and the frequency converter 2x outputs the signal of 325 MHz. Alternatively, signals of other frequencies may be output as far as all the signals do not overlap with each other on the frequency axis.

In Embodiment 1, the tuner 4a selects the signal of 141 MHz, the tuner 4b selects the signal of 149 MHz, the tuner 4x selects the signal of 325 MHz, and the tuners then perform frequency conversion to 36.125 MHz. The signals to be selected, and the frequency of the frequency conversion are not restricted to the above as far as the tuners can operate.

In Embodiment 1, mechanical vibrations in an airplane are assumed to have a frequency in the range of 10 Hz to 2 kHz. The frequency may have a value other than those specified in DO-160 D standard. In Embodiment 1, the natural angular frequency of each PLL frequency synthesizer is set to about 8 krad/sec. Alternatively, the natural angular frequency may be set to another value as far as the value is in the vicinity of the maximum frequency of mechanical vibrations.

In Embodiment 1, the phase comparison frequency of each PLL frequency synthesizer is set to 1 MHz. The frequency may have another value as far as the natural angular frequency is in the vicinity of the maximum frequency of mechanical vibrations.

In Embodiment 1, the digital filter 34 of the carrier recovery section is configured to be of the secondary type, and the operating rate is set to an integer multiple of the symbol rate, and the loop bandwidth is set to about 15 kHz. Other configuration and value may be employed as far as the frequency is higher than the maximum frequency of mechanical vibrations.

In Embodiment 3, the reinforcing plate 45 is pasted to the upper side of the microstrip line 42. Alternatively, the reinforcing plate 45 may be pasted to the lower side or both the sides of the microstrip line. In Embodiment 3, the reinforcing plate 45 is made of the same material as the printed circuit board 41. Alternatively, the reinforcing plate may be made of a different material as far as characteristics of the microstrip line is adversely affected. In Embodiment 3, an epoxy or silicone adhesive agent having excellent insulating properties is used as the adhesive agent 46. The adhesive agent may consists of other components as far as characteristics of the microstrip line is adversely affected.

In Embodiment 6, the capacitors C1 to C3 used in the loop filter 22, and the capacitors C4 to C6 used in the resonance section of the voltage controlled oscillator 23 which are included in the PLL frequency synthesizers are of the film type. Alternatively, only a part of the capacitors may be of the film type.

Meanwhile the various means of the present invention can be realized by using program of computer.

What is claimed is:

1. A transmitting and receiving apparatus comprising: modulating means for modulating an input digital data; first frequency converting means for converting a signal output from said modulating means into a signal of a predetermined frequency, amplifying/branching means for amplifying and branching a signal output from said first frequency converting means; second frequency converting means for converting a signal output from said amplifying branching means, into a signal of a predetermined frequency; and demodulating means for demodulating a digital data from a signal output from said second frequency converting means, wherein each of said first and second frequency converting means comprises a PLL frequency synthesizer, said demodulating means has a carrier recovery section, and natural angular frequencies of said PLL frequency synthesizers are set to be equal to a maximum frequency of mechanical vibrations which are externally applied, or in a predetermined width above and below the maximum frequency, or a loop filter bandwidth of said carrier recovery section is set to be higher by a predetermined amount than the maximum frequency of mechanical vibrations which are externally applied.

2. A transmitting and receiving apparatus according to claim 1, wherein each of said PLL frequency synthesizers has:

a PLL synthesizer IC to which a crystal oscillator is externally connected; a loop filter which filters a signal output from said PLL synthesizer IC; a voltage controlled oscillator in which an oscillation frequency is changed in accordance with a signal output from said loop filter; an amplifying IC which amplifies a signal output from said voltage controlled oscillator; and a branch coil which branches a signal output from said amplifying IC, and one of signals output from said branch coil is input to said PLL synthesizer IC.

3. A transmitting and receiving apparatus according to claim 1, wherein said carrier recovery section has:

an A/D conversion section which converts an input analog signal into a digital signal; a quadrature detection section which performs quadrature calculation on a data output from said A/D conversion section; a modulating component removal section which removes modulating components from a data output from said quadrature detection section; a digital filter section which filters a data output from said modulating component removal section; and an oscillation section in which an oscillation frequency is changed in accordance with a data output from said digital filter section, and each of said oscillation section and said A/D conversion section input a data to said quadrature detection section.

4. A transmitting and receiving apparatus according to claim 1, wherein a phase comparison frequency of a PLL synthesizer IC included in said PLL frequency synthesizer is set to be higher than the maximum frequency of mechanical vibrations which are externally applied.

5. A transmitting and receiving apparatus according to claim 1, wherein the predetermined width is a range of ±50% above and below with respect to the maximum frequency, and the predetermined amount is 5 kHz.

6. A transmitting and receiving apparatus according to claim 5, wherein each of said PLL frequency synthesizers has:

a PLL synthesizer IC to which a crystal oscillator is externally connected; a loop filter which filters a signal output from said PLL synthesizer IC; a voltage controlled oscillator in which an oscillation frequency is changed in accordance with a signal output from said loop filler; an amplifying IC which amplifies a signal output from said voltage controlled oscillator, and a branch coil which branches a signal output from said amplifying IC, and one of signals branched from said branch coil is input to said PLL synthesizer IC.

7. A transmitting and receiving apparatus according to claim 5, wherein said carrier recovery section has:

an A/D conversion section which converts an input analog signal into a digital signal; a quadrature detection section which performs quadrature calculation on a data output from said A/D conversion section; a modulating component removal section which removes modulating components from a data output from said quadrature detection section; a digital filter section which filters a data output from said modulating component removal section; and an oscillation section in which an oscillation frequency is changed in accordance with a data output from said digital filter section, and each of said oscillation section and said A/D conversion section input a data to said quadrature detection section.

8. A transmitting and receiving apparatus according to claim 5, wherein a phase comparison frequency of a PLL synthesizer IC included in said PLL frequency synthesizer is set to be higher than the maximum frequency of mechanical vibrations which are externally applied.

* * * * *

UNITED STATES PATENT AND TRADEMARK OFFICE
CERTIFICATE OF CORRECTION

PATENT NO. : 6,859,502 B1
DATED : February 22, 2005
INVENTOR(S) : Akihiro Tatsuta et al.

It is certified that error appears in the above-identified patent and that said Letters Patent is hereby corrected as shown below:

<u>Title page,</u>
Item [56], References Cited, FOREIGN PATENT DOCUMENTS, please change "20-21009" to -- 10-21009 --.

Signed and Sealed this

Fourth Day of October, 2005

JON W. DUDAS
*Director of the United States Patent and Trademark Office*